United States Patent [19]
Parker

[11] Patent Number: 5,900,796
[45] Date of Patent: May 4, 1999

[54] ELECTRIC NOISE SUPPRESSOR

[75] Inventor: Richard G. Parker, Wallkill, N.Y.

[73] Assignee: Fair-Rite Products Corporation, Wallkill, N.Y.

[21] Appl. No.: 08/865,451

[22] Filed: May 29, 1997

Related U.S. Application Data

[60] Provisional application No. 60/039,552, Feb. 26, 1997.

[51] Int. Cl.$^6$ .............................. H01F 27/04; H01F 27/26
[52] U.S. Cl. ................................ 336/92; 174/92; 333/12; 336/175; 336/176; 336/212
[58] Field of Search .............................. 336/92, 175, 176, 336/212; 174/92, 52.1, 50; 333/12, 81 R, 182, 243

[56] References Cited

U.S. PATENT DOCUMENTS

| | | |
|---|---|---|
| 3,846,725 | 11/1974 | Mears, Jr. . |
| 4,885,559 | 12/1989 | Nakano . |
| 4,970,476 | 11/1990 | Kitagawa .................................. 336/176 |
| 4,972,167 | 11/1990 | Fijioka ........................................ 336/92 |
| 5,486,803 | 1/1996 | Igarashi et al. . |

FOREIGN PATENT DOCUMENTS

| | | | |
|---|---|---|---|
| 562-14770 | 4/1987 | Japan ...................................... 336/176 |
| 2 201 840 | 9/1988 | United Kingdom .................... 336/176 |

*Primary Examiner*—Thomas J. Kozma
*Attorney, Agent, or Firm*—Anthony J. Casella; Gerald E. Hespos; Ludomir A. Budzyn

[57] ABSTRACT

An electric noise suppressor is provided for suppressing high-frequency electric noise which comprises a thermoplastic housing and two ferrite members disposed therein. The thermoplastic housing is formed from two hingedly connected case halves, which are substantially identical. A ferrite member is secured to each case half by a laminated compressible adhesive-foam element, which is comprised of a resilient foam core layer and opposing adhesive layers disposed thereabout. Due to the resiliency of the foam core layer, the ferrite members are pressed into tight engagement within the thermoplastic housing. The end walls of the thermoplastic housing are formed with circular apertures, which are each formed with a diameter which is slightly smaller than the diameter of the cable which is engaged by the electric noise suppressor. The dimensional differences between the cable and the apertures allows the end walls to grippingly engage the cable at a predetermined location. With the electric noise suppressor being in a closed position, the thermoplastic housing ensures the ferrite members encircle a predetermined location along the length of a cable. A locking arrangement may be provided with the thermoplastic housing to maintain the thermoplastic housing in a closed position at the predetermined location.

10 Claims, 4 Drawing Sheets

ELECTRIC NOISE SUPPRESSOR

This application claims the benefit of Provisional Application No. 60/039,552 filed Feb. 26, 1997.

BACKGROUND OF THE INVENTION

1. Field of the Invention

This invention relates to devices for suppressing high-frequency electric noise, more particularly, to a new and improved ferrite electric noise suppressing device.

2. Description of the Prior Art

Ferrite is widely used to prevent electronic data transmitting cables from either receiving or transmitting unwanted high-frequency noise. The ferrite is formed to fully encompass the data transmitting cable at particular locations to prevent the cable from acting as an antenna for the unwanted high-frequency noise.

To maximize electric noise suppression, the ferrite must fully encompass the circumference of the cable at each desired location. In the prior art, electric noise suppressors have been formed from two symmetrical ferrite members joined about a cable with tape or wire ties. As an improvement over these early designs, electric noise absorbers are combined with plastic casings which house the ferrite members. The prior art designs, such as U.S. Pat. No. 4,885,559 entitled "ELECTRIC NOISE ABSORBER", include various biasing fingers formed unitary as part of the plastic casing which urge the ferrite members into engagement about the transmitting cable. The prior art plastic casings are also formed with gripping fingers for securing the casings to the desired location along the length of the transmitting cable, and with inwardly projecting fingers formed as part of the casing for loosely holding the ferrite in the casing. The ferrite members are not formed to tightly engage the transmitting cable, and the casings must be relied upon for maintaining the noise suppressor at the desired location.

The biasing fingers, the gripping fingers and the projecting fingers of the prior art noise suppressor casings are formed unitary therewith and require complicated molds and manufacturing procedures to be formed. Other prior art designs have been introduced to overcome these difficulties in manufacturing the complicated casing structures, and such other designs have utilized a separately formed metal spring which is mounted in the plastic casings for biasing the ferrite members about the cable as, for example, U.S. Pat. No. 5,486,803 entitled "SIGNAL DISCRIMINATOR". These designs obviously result in additional manufacturing costs since manufacturing and preparation of the metal spring members are required along with the assembly effort of mounting the metal spring members into the casing.

It is an object of the subject invention to provide an electric noise suppressor having a plastic casing in combination with biasing means which is easily manufactured and assembled.

SUMMARY OF THE INVENTION

To satisfy the above-stated object, the subject invention preferably comprises a thermoplastic casing formed with two substantially symmetrical, semi-octagonal halves, each housing a semi-octagonal ferrite member secured to each case half by a laminated compressible adhesive-foam element of sufficient thickness to force the ferrite members together.

More specifically, the casing of the subject invention is composed of two semi-octagonal case halves, each formed with a smooth inner surface. A piece of a laminated compressible adhesive-foam element, which comprises a resilient foam core layer with opposing adhesive layers disposed thereabout, is secured to the inner surface of each case half, and a semi-octagonal ferrite member is provided for each case half which is adhered to the laminated compressible adhesive-foam element.

The two case halves are hingedly connected to allow the electric noise suppressor to be easily opened and closed about an electronic data transmitting cable. The ferrite members are each formed with a semi-cylindrical channel having a radius slightly greater than the radius of the transmitting cable such that there will be some clearance between the transmitting cable and the ferrite members with the electric noise suppressor in a closed position. The resiliency of the foam core of the laminated compressible adhesive-foam element urges the ferrite members into tight engagement to ensure unwanted electric noise is suppressed. Cooperating locking members are provided on the case halves to maintain the electric noise suppressor in a closed position with the ferrite members being in tight engagement.

The case halves are also formed with ends which are formed to grippingly engage the transmitting cable. The end of each case half tapers outward and downward and includes a semi-circular recess having a radius slightly less than the radius of the cable. A slot extends from each recess in a direction perpendicular to the open mouth of each case half which subdivides each case half end into two symmetrical panels. Each panel has an arcuate cable gripping edge which approximately defines half the semi-circular recess formed in each end of each case half. The edges of each panel which extend along the perimeter of the open face of each case half are formed with setbacks such that, with the electric noise suppressor in a closed position, each end of the electric noise suppressor defines a central substantially circular aperture with four slots extending radially therefrom. The apertures are formed with radii which are slightly less than the radius of the cable intended to be encompassed by the electric noise suppressor.

The thickness of the panels is decreased midway between the cable gripping edge of the panel and the point at which the panel joins the outside of the case half. This creates an area of preferential bending when the panel is stressed by being pressed against the cable when the case is closed. The panels are forced concavely outward while maintaining the edges defining the circular apertures in fixed position on the cable, gripping the entire circumference of the cable. This obviates any tendency for piercing or distorting of the cable as in prior art which utilized teeth or gripping fingers on the edge of each semi hole to secure the cable.

These and other features of the invention are better understood through a study of the following detailed description of the invention and the accompanying drawings.

DETAILED DESCRIPTION OF THE INVENTION

Figure 1:
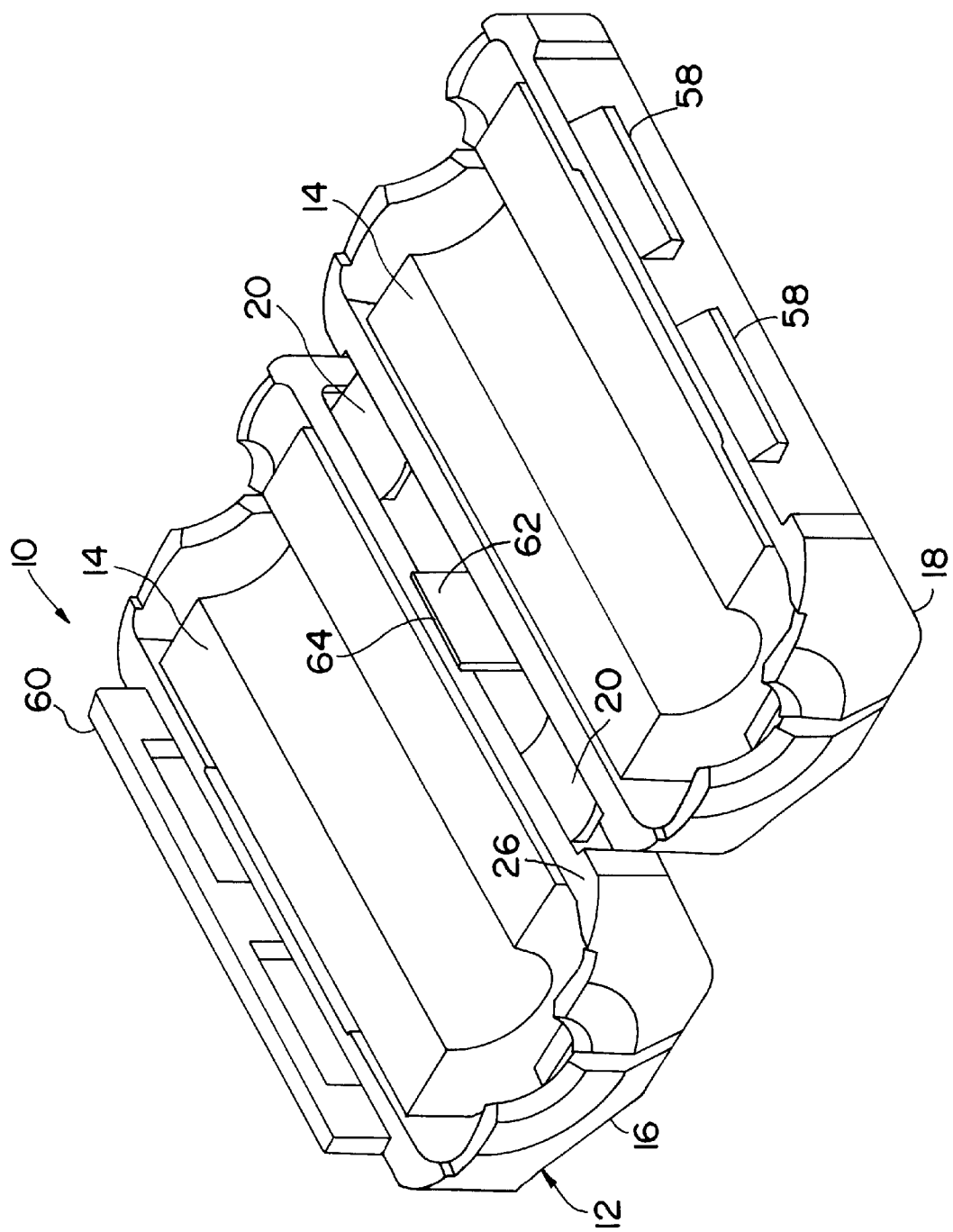
FIG. 1 is a perspective view of the new and improved electric noise suppressor of the subject invention.

Referring generally to FIG. 1, a noise suppressor 10 is provided which preferably comprises a thermoplastic housing 12 and two semi-octagonal ferrite members 14, 14 mounted therein. The noise suppressor 10 is formed to securely engage an electronic data transmitting cable at a desired location, as described below.

Figure 2:
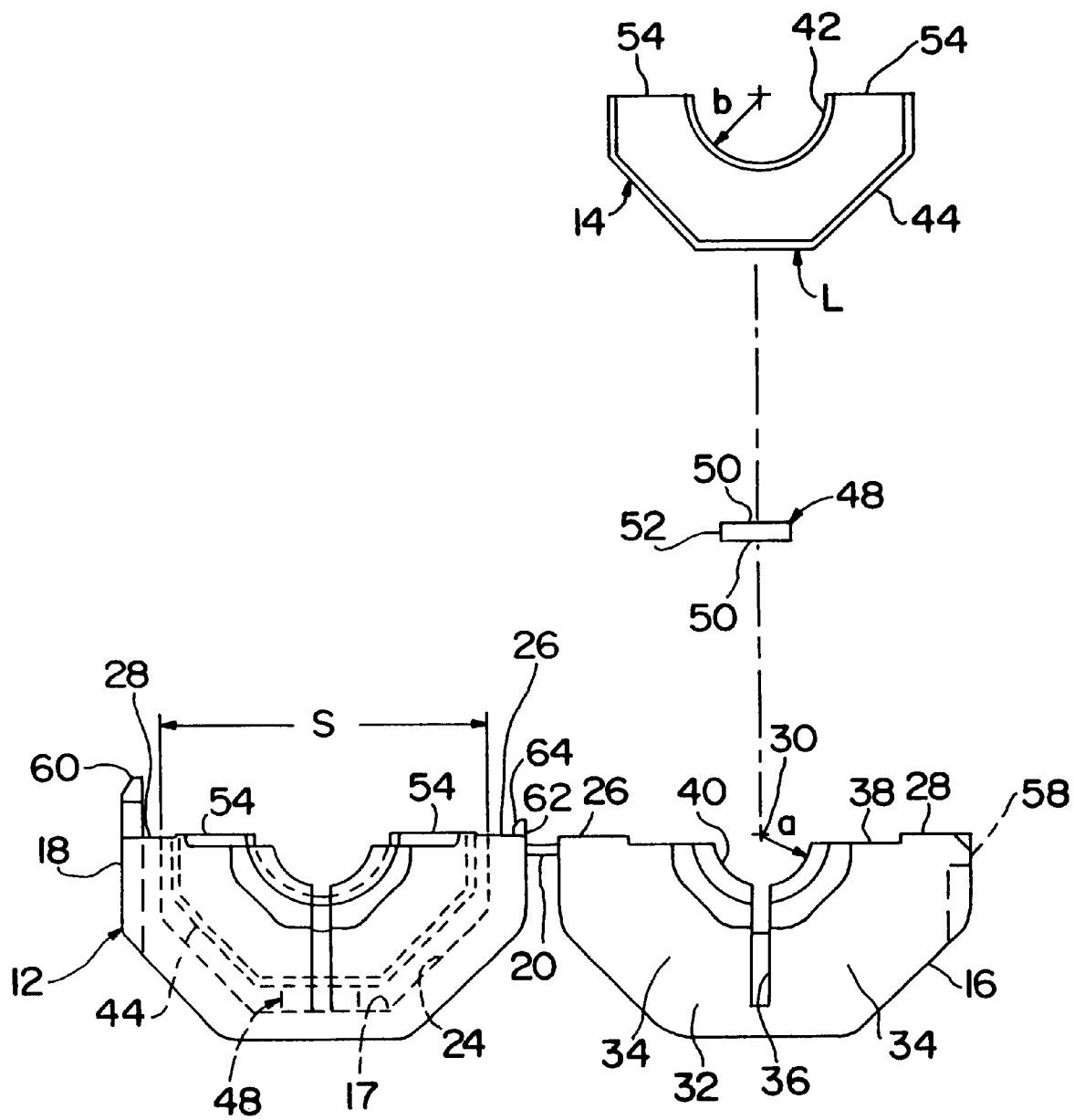
FIG. 2 is an exploded view showing the assembly of the new and improved electric noise suppressor of the subject invention.
Figure 3:
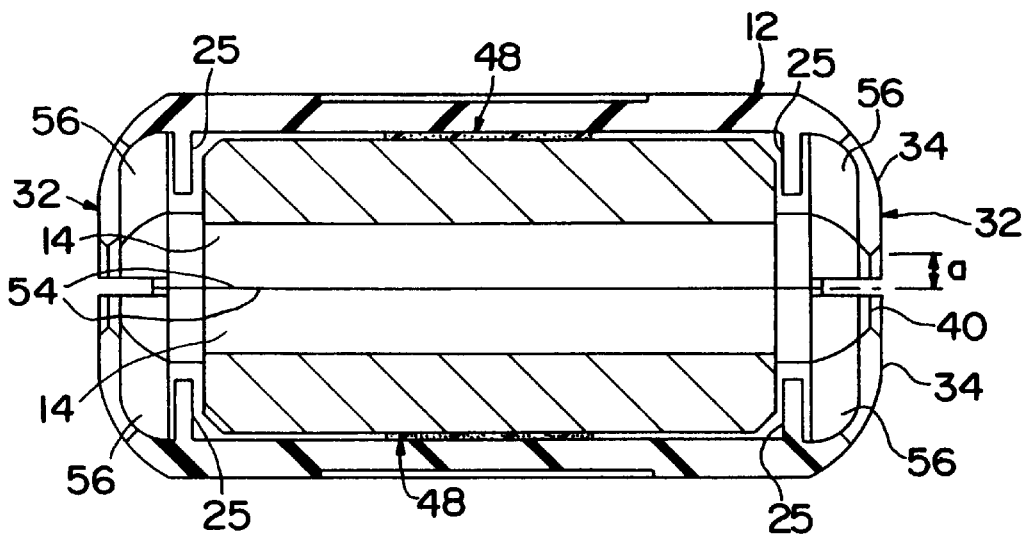
FIG. 3 is a partial cross-sectional view of the new and improved electric noise suppressor of the subject invention in a closed position.

Referring to FIG. 2, the thermoplastic housing 12 includes two hingedly connected case halves 16, 18 which are connected through hinges 20. The case halves 16, 18 are formed to be substantially identical. As shown in FIG. 2, each case half 16, 18 has a generally semi-octagonal shape with a flat portion 17, preferably having a width approximately ⅓ the inside dimension S of the respective case half 16, 18, being disposed opposite the open side of each case half 16, 18. Inner surfaces 24 of the case halves 16, 18 are smoothly formed and shaped to be substantially parallel to the general shape of the case halves 16, 18. Preferably, two guide blocks 25 extend from the inner surface 24 of each of the respective case halves 16, 18. The guide blocks 25 are longitudinally spaced in each of the case halves 16, 18 at a distance which is slightly greater than the length of the ferrite member 14 mounted therein, as shown in FIG. 3. The guide blocks 25 ensure proper longitudinal positioning of the ferrite members 14, 14 relative to the case halves 16, 18. Each of the case halves 16, 18 is also formed with a longitudinal inner edge 26 and a longitudinal outer edge 28. The hinges 20 extend between the inner edges 26 of the case halves 16, 18. The general semi-octagonal shape of the case halves 16, 18 is generated from a center point 30 which is substantially coplanar with the top surfaces of the inner and outer edges 26, 28.

Each of the case halves 16, 18 is provided with opposing outwardly tapered end walls 32, as shown in FIG. 3. Referring to FIG. 2, each of the end walls 32 includes two panels 34 which are separated by slot 36 and upper edges 38 which are set back from the inner and outer edges 26, 28 of the case halves 16, 18. The upper edges 38 are preferably set back from the inner and outer edges 26, 28 at a distance approximately half the width of the slots 36. With this arrangement and the thermoplastic housing 12 being in a closed position, the inner and outer edges 26, 28 are respectively in contact, and the upper edges 38 define slots between opposing panels 34 of the case halves 16, 18 having widths substantially equal to that of the slots 36. An arcuate edge 40 extends between the upper edge 38 of each of the panels 34 and the respective slot 36 which defines a radius "a" from the center point 30 such that, with the thermoplastic housing 12 being in a closed position, the arcuate edges 40 collectively define a substantially circular aperture in each of the end walls 32 having a radius "a".

Figure 4:
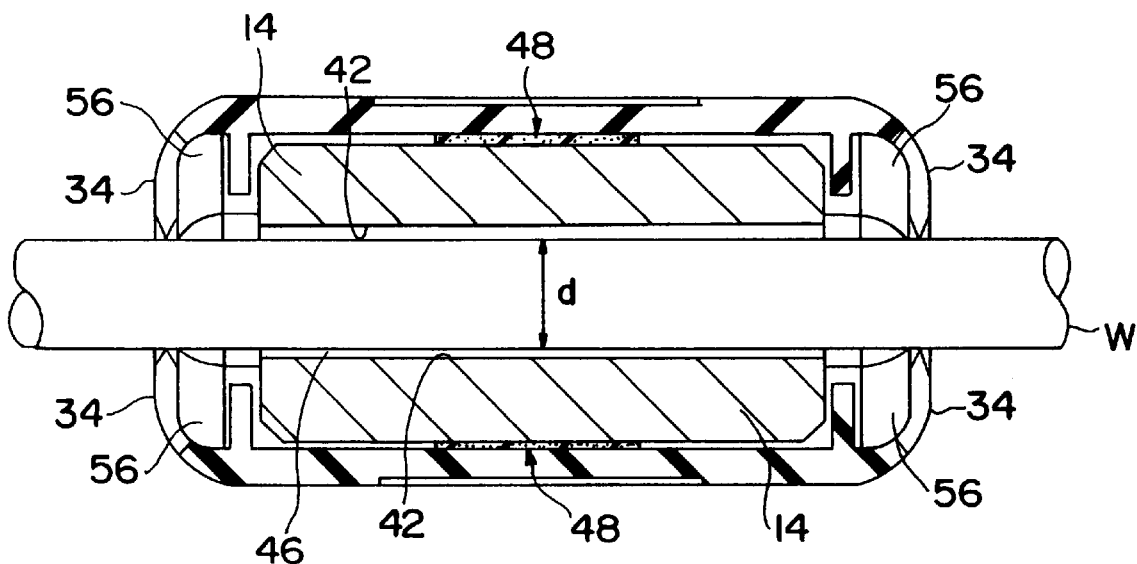
FIG. 4 is a partial cross-sectional view similar to FIG. 3 of the new and improved electric noise suppressor of the subject invention in a closed position engaged about an electronic data transmitting cable.

The semi-octagonal ferrite members 14, 14 are each formed with an inner channel 42, having a radius of "b", and an outer surface 44, as shown in FIG. 2. The radius "b" is selected to be greater than the radius of the cable which is to be engaged by the noise suppressor 10. As shown in FIG. 4, the cable W has a diameter "d". The inner channel 42 is formed with a radius "b" which is greater than one half the diameter "d" of the cable W, resulting in an annular space 46 being formed about the cable W with the noise suppressor 10 being in a closed position about the cable W. The outer surfaces 44 of the ferrite members 14, 14 must be formed to smaller dimensions than the inner surfaces 24 of the case halves 16, 18 to allow assembly of the noise suppressor 10 as described below.

A piece of a laminated compressible adhesive-foam element 48 is used to fixedly mount each of the ferrite members 14, 14 into one of the case halves 16, 18. Preferably, the laminated compressible adhesive-foam element 48 is formed with opposing adhesive layers 50 disposed about a resilient foam core layer 52 of sufficient thickness to function as a resilient biasing means for the ferrite members 14, 14. The laminated compressible adhesive-foam element 48 may be formed with a central core layer comprising any resilient material known to those skilled in the art to be compatible with use in an electric noise suppressor. As can be appreciated, certain resilient materials which may have properties which are undesirable for use in an electric noise suppressor should be avoided. Also, the central core layer may include a plurality of layers of a single material or different materials. As used herein, "laminated compressible adhesive-foam element" is defined as an element having at least one resilient central layer formed with opposing adhesive layers.

As shown in FIG. 2, each of the ferrite members 14, 14 is mounted in the respective case half 16, 18 by applying one of the adhesive layers 50 of the laminated compressible adhesive-foam element 48 to the outer surface 44 of the respective ferrite member 14 at a location L. Then, the respective ferrite member 14 is pressed into the respective case half 16, 18 sufficiently to allow the unobstructed adhesive layer 50 to come in contact with the flat portion 17 of the inner surface 24, opposite the open side of the case half 16, 18. The ferrite members 14, 14 are mounted to the case halves 16, 18 with the inner channels 42 aligned to extend between the arcuate edges 40 of the respective case half 16, 18 between the guide blocks 25. The laminated compressible adhesive-foam element 48 must be formed with a thickness which will maintain upper surfaces 54 of the ferrite member 14 above the inner and outer edges 26, 28. Consequently, with the noise suppressor 10 in a closed position, the core layers of the laminated compressible adhesive-foam elements 48 will bias the upper surfaces 54 of both of the ferrite members 14, 14 into tight face-to-face contact, as shown in FIG. 3.

In sizing the electric noise suppressor 10 for a particular cable W, the radius "a" defined by the arcuate edges 40 is selected to be slightly less than half the diameter "d" of the cable W. Prior to engagement of the cable W, the arcuate edges 40 are dimensioned to overlap the region intended for the cable W, with the end walls 32 being in unbent positions. To engage the cable W by the electric noise suppressor 10, the longitudinal axis of the cable W is aligned between the arcuate edges 40 of both end walls 32 of one of the case halves 16, 18 and parallel to the respective inner channel 42 of the ferrite member 14, with the portion of the cable W intended for electric noise suppression located between the end walls 32, and the case halves 16, 18 are rotated about the hinges 20 into a closed position, encompassing the cable W. With the cable W being engaged, to compensate for the overlap between the arcuate edges 40 and the cable W, each of the panels 34 is formed with a thinned panel section 56 intermediate the length thereof, which allows the panels 34 to concavely buckle and tightly engage the cable W along the arcuate edges 40 thereof and secure the noise suppressor 10 to a fixed position on the cable W as shown in FIG. 4.

Cooperating locking members 58, 60 are provided on the outer edges 28 of the case halves 16, 18 which allow the electric noise suppressor 10 to be securely maintained at a desired location along the length of the cable W. Any type of locking arrangement known by those skilled in the art may be used to maintain the case halves 16, 18 in a closed position. As an example of a possible locking arrangement, FIG. 1 shows two protruding detents 58, formed on the outer surface of the case half 18, and an upstanding locking member 60, extending from the case half 16. The locking member 60 is formed with two openings dimensioned to accommodate the detents 58. The detents 58 are tapered with the tapered faces of the detents generally facing the same direction in which the locking member 60 extends. To lock the case halves 16, 18 in a closed position, the case halves 16, 18 are rotated about the hinges 20 with the tapered faces of the detents 58 coming into engagement with the locking member 60. As force is applied to urge the case halves 16, 18 into face-to-face engagement, the tapered faces of the detents 58 slide against the locking member 60, with the detents 58 eventually registering with the openings formed in the locking member 60.

A locking arrangement must be selected which will securely maintain the case halves 16, 18 in a closed position. The locking arrangement described above may be disengaged by transversely sliding the case half 18, relative to the case half 16, in a direction towards the hinges 20 to a point where the detents 58 do not register with the openings of the locking member 60. To prevent inadvertent disengagement of the described locking arrangement, an upstanding stop 62 may be disposed along the inner edge 26 of the case half 12. The stop 62 is formed to extend above the inner edge 26 to limit transverse movement of the case half 18 which may lead to disengagement of the detent 58 from the locking member 60. The stop 62, however, must be dimensioned to not prevent the closure of the case halves 16, 18. The case half 18 must be able to rotate about the hinges 20 and above the stop 62. Preferably, the stop 62 is formed with an upper, tapered edge 64, with a tapered face generally facing the locking member 60. The taper of the edge 64 provides additional clearance for the rotation of the case half 18 above the stop 62.

Figure 5:
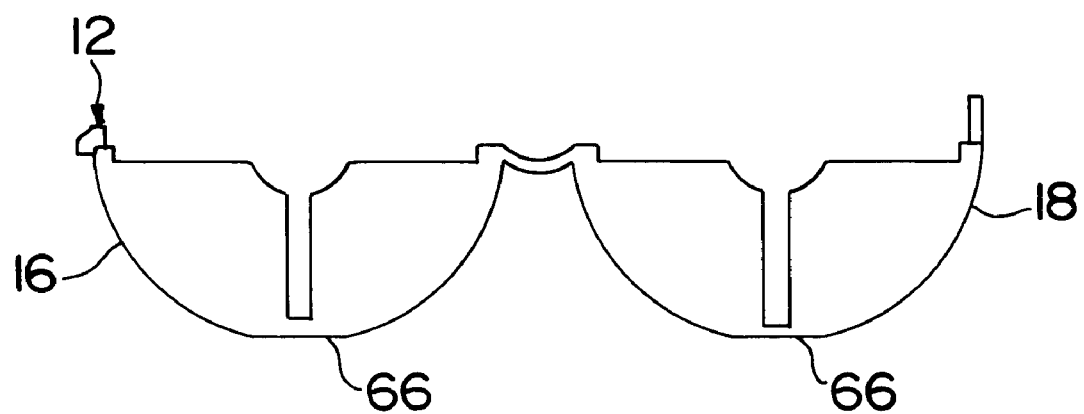
FIG. 5 is a side view of an alternative embodiment of the plastic housing of the new and improved electric noise suppressor of the subject invention.

Alternatively, the housing 12 may be formed with any general shape. For example, as shown in FIG. 5, the case halves 16, 18 may be formed by rounding a portion of each of the case halves 16, 18 leaving a planar surface for mounting the electric noise suppressor in a working environment, as shown by truncations 66. In addition, the case halves 16, 18 may be formed with a rectangular shape. With each alternative embodiment, the ferrite members 14, 14 are generally formed with the same shape as the case halves 16, 18. The remaining features of the alternative embodiments are as described above.

Although preferred embodiments of the invention have been disclosed for illustrative purposes, those skilled in the art will appreciate that various modifications, additions and substitutions are possible, without departing from the scope and spirit of the invention as disclosed in the accompanying claims.

I claim:

1. An electric noise suppressor for suppressing high frequency electric noise to and from a cable, said suppressor comprising:

a thermoplastic casing formed by at least two articulated case elements, said casing having an inner surface, said inner surface defining a chamber;

at least two ferrite members disposed in said chamber, said ferrite members having inner surfaces which cooperatively form a cable passageway; and laminated compressible adhesive-foam means adherently attached to both said ferrite members and to said inner surface of said thermoplastic casing, said laminated compressible adhesive-foam means for biasing said ferrite members into cooperative engagement to define said cable passageway.

2. An electric noise suppressor as in claim 1, wherein said laminated compressible adhesive-foam means comprises at least one resilient core layer and opposing adhesive layers disposed thereabout, wherein said at least one resilient core layer comprises foam.

3. An electric noise suppressor as in claim 1, wherein said casing is formed with two opposing end walls, and wherein said cable passageway is defined to substantially extend between said end walls.

4. An electric noise suppressor as in claim 3, wherein each said end wall is formed with means for gripping the cable, and wherein said cable passageway is defined to substantially extend between said means for gripping the cable.

5. An electric noise suppressor as in claim 4, wherein the cable defines a diameter, and wherein each said means for gripping the cable includes an aperture formed to define a dimension less than the diameter of the cable.

6. An electric noise suppressor for suppressing high frequency electric noise to and from a cable, said suppressor comprising:

a thermoplastic casing formed by two substantially identical case halves, said case halves being hingedly connected, each said case half having an inner surface;

two substantially identical ferrite members having inner surfaces which cooperatively form a cable passageway, each said ferrite member being disposed in a single said case half; and laminated compressible adhesive-foam means for adherently securing said ferrite members to said inner surface of respective said case half, and for biasing said ferrite members into cooperative engagement to define said cable passageway.

7. An electric noise suppressor as in claim 3, wherein said laminated compressible adhesive-foam means comprises at least one resilient core layer and opposing adhesive layers disposed thereabout, wherein said at least one resilient core layer comprises foam.

8. An electric noise suppressor as in claim 6, wherein said casing is formed with two opposing end walls, and wherein said cable passageway is defined to substantially extend between said end walls.

9. An electric noise suppressor as in claim 8, wherein each said end wall is formed with means for gripping the cable, and wherein said cable passageway is defined to substantially extend between said means for gripping the cable.

10. An electric noise suppressor as in claim 9, wherein the cable defines a diameter, and wherein each said means for gripping the cable includes an aperture formed to define a dimension less than the diameter of the cable.

* * * * *